United States Patent [19]
McLaury

[11] Patent Number: 5,636,175
[45] Date of Patent: Jun. 3, 1997

[54] ROW DECODER/DRIVER CIRCUIT FOR DETERMINING NON SELECTED WORDLINES AND FOR DRIVING NON-SELECTED WORDLINES TO A POTENTIAL LESS THAN THE LOWEST POTENTIAL OF THE DIGIT LINES

[75] Inventor: Loren L. McLaury, Boise, Id.

[73] Assignee: Micron Semiconductor, Inc., Boise, Id.

[21] Appl. No.: 374,264

[22] Filed: Jan. 18, 1995

Related U.S. Application Data

[62] Division of Ser. No. 62,649, May 14, 1993, Pat. No. 5,410,508.

[51] Int. Cl.$^6$ ............................................. G11C 7/00
[52] U.S. Cl. .................... 365/230.06; 365/189.11; 365/230.08; 326/108
[58] Field of Search ............. 365/189.09, 189.11, 365/230.06, 230.08; 326/108, 105, 106

[56] References Cited

U.S. PATENT DOCUMENTS

| | | | |
|---|---|---|---|
| 4,543,500 | 9/1985 | McAlexander, III et al. | 307/530 |
| 4,897,568 | 1/1990 | Chern et al. | 307/530 |
| 4,897,820 | 1/1990 | Shiomi | 365/230.08 |
| 5,051,959 | 9/1991 | Nakano | 365/230.06 |
| 5,132,575 | 7/1992 | Chern | 307/530 |
| 5,175,450 | 12/1992 | Chern | 307/530 |
| 5,206,551 | 4/1993 | Chern | 307/530 |
| 5,245,578 | 9/1993 | McLaury | 365/189.05 |
| 5,257,238 | 10/1993 | Lee | 365/230.06 |
| 5,267,201 | 11/1993 | Floss et al. | 365/189.09 |
| 5,283,761 | 2/1994 | Gillingham | 365/189.09 |
| 5,297,104 | 3/1994 | Nakashima | 365/230.06 |
| 5,302,870 | 4/1994 | Chern | 307/530 |
| 5,311,481 | 5/1994 | Casper et al. | 365/230.06 |
| 5,324,998 | 6/1994 | Powell | 365/185.17 |
| 5,351,217 | 9/1994 | Jeon | 365/230.06 |
| 5,410,508 | 4/1995 | McLaury | 365/230.06 |
| 5,416,747 | 5/1995 | Ohira | 365/230.06 |

Primary Examiner—David C. Nelms
Assistant Examiner—Son Mai

[57] ABSTRACT

A semiconductor integrated circuit having a decode circuit for selecting selected and non-selected wordlines and having a driver circuit for driving a potential to the non-selected wordlines which is less than the lowest potential to which any digit lines are driven during the operation of the semiconductor integrated circuit.

15 Claims, 10 Drawing Sheets

FIG. 1
(RELATED ART)

FIG. 2
(RELETED ART)

ROW DECODER/DRIVER CIRCUIT FOR DETERMINING NON SELECTED WORDLINES AND FOR DRIVING NON-SELECTED WORDLINES TO A POTENTIAL LESS THAN THE LOWEST POTENTIAL OF THE DIGIT LINES

This is a request for filing a: Divisional of application(s) Ser. No. 08/062,649 filed on May 14, 1993 now U.S. Pat. No. 5,410,508.

FIELD OF THE INVENTION

The present invention relates to integrated circuits, and more particularly, to a circuit and method for pumping non-selected wordlines to a negative potential.

BACKGROUND OF THE INVENTION

A dynamic random access memory (DRAM) device consists of an arrangement of individual memory cells. Each memory cell comprises a capacitor capable of holding a charge and a field effect transistor, hereinafter referred to as an access transistor, for accessing the capacitor charge. The charge is referred to as a data bit and can be either a high voltage or a low voltage. Therefore, the memory has two states; often thought of as the true logic state and the complementary logic state. There are two options available in a DRAM memory: a bit of data may be stored in a specific cell in the write mode, or a bit of data may be retrieved from a specific cell in the read mode. The data is transmitted on signal lines, also called digit lines, which are coupled to Input/Output lines through field effect transistors used as switching devices. The switching devices are called decode transistors. For each bit of data stored, its true logic state is available at an I/O line and its complementary logic state is available at a line designated I/O*. Thus each cell has two digit lines, digit and digit*, corresponding to I/O and I/O* respectively. For purposes of this discussion, I/O and I/O* lines are often referred to as just I/O lines.

Typically, the memory cells are arranged in an array and each cell has an address identifying its location in the array. The array comprises a configuration of intersecting rows and columns and a memory cell is associated with each intersection. In order to read from or write to a cell, the particular cell in question must be selected, also called addressed. The address for the selected cell is represented by input signals to a row decoder and to a column decoder. The row decoder activates a wordline in response to the row address. The selected wordline activates the access transistor for each of the memory cells in electrical communication with the-selected wordline. Next the column decoder activates a column decoder output in response to the column address. The active column decoder output selects the desired digit line pair. For a read operation the selected wordline activates the access transistors for a given row address, and data is latched to the digit line pairs. The column decoder output selects and activates the decode transistors such that the data is transferred from the selected digit line pair to the I/O lines.

U.S. Pat. No. 5,175,450 entitled "Apparatus for Providing Multi-Level Potentials at a Sense Node" is herein incorporated by reference to further the readers understanding of a DRAM.

The row decoder comprises decode circuitry for determining which wordline is selected for a desired address and for determining which wordlines are non-selected. The row decoder also comprises driver circuitry for driving the selected and the non-selected wordlines to potentials having active and inactive logic states respectively. The active wordline has a potential capable of activating the access transistors in electrical communication with the active wordline and the inactive wordline has a potential capable of deactivating the access transistors in electrical communication with the non-selected wordlines. For this discussion the potential of a selected wordline is higher than the potential of a non-selected wordline.

Typically the decode circuitry comprises a primary decoder and a secondary decoder for generating a primary select signal, $S_1^*$, and at least one secondary select signal, $S_2$, respectively. The asterisk indicates that the signal is active low. The primary and secondary select signals are used as inputs to the driver circuitry of the row decoder. The driver portion typically comprises an inverter portion and a latch portion. The primary select signal is typically inverted to the wordline by the inverter portion, and the secondary select signal regulates the switching of the primary select signal to the inverter portion. The latch portion latches a non-selected wordline to the potential capable of deactuating the access transistor.

Figure 1:
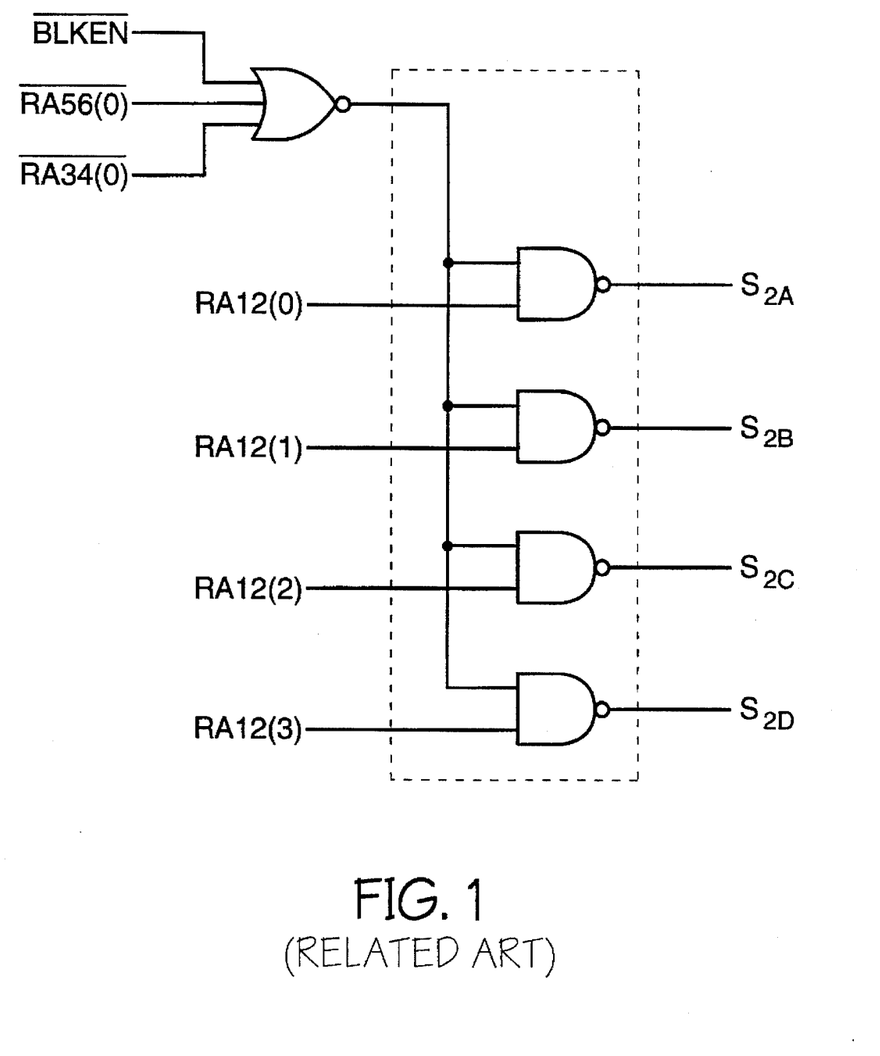
FIG. 1 is a schematic of a portion of a MOS NAND decoder for a row decoder circuit of the related art.
Figure 2:
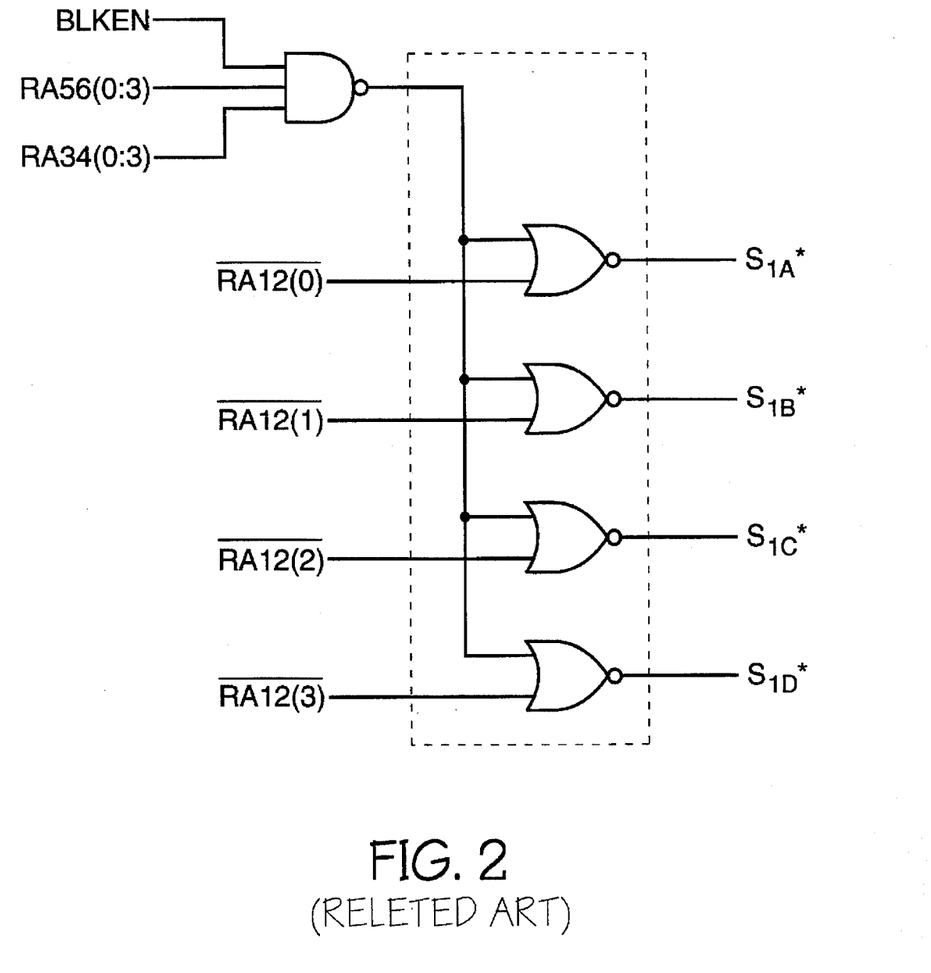
FIG. 2 is a schematic of a portion of a MOS NOR decoder for a row decoder circuit of the related art.
Figure 3:
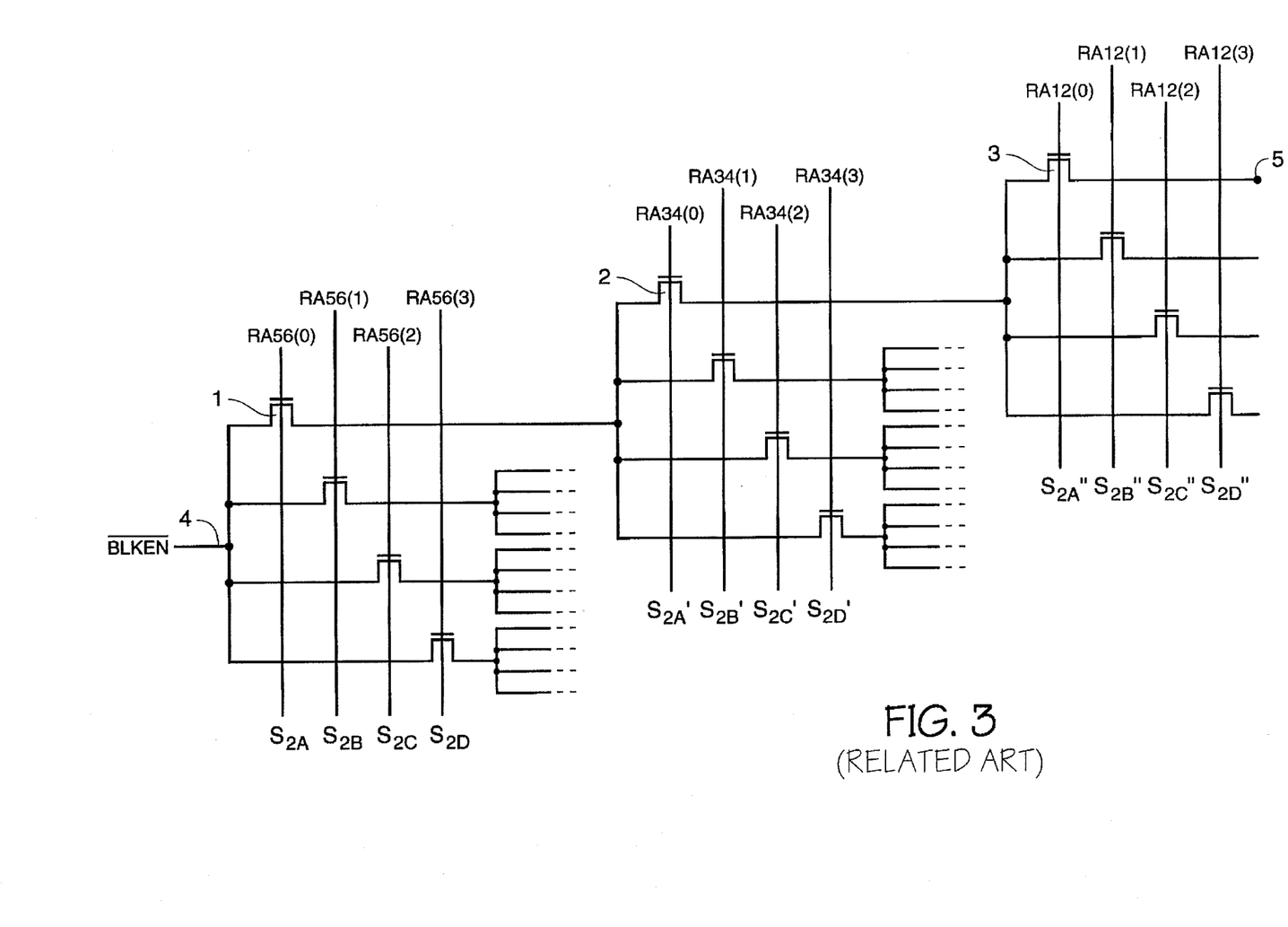
FIG. 3 is a schematic of a portion of a tree decoder for a row decoder circuit of the related art.

Typical decoder circuitries can comprise either MOS decodes utilizing NAND circuitry or NOR circuitry, or tree decode circuitry. FIGS. 1, 2 and 3 are examples of a portion of the NAND, NOR, and tree decode circuitries respectively. The decode circuitries of the row decoder provide predecoded addresses to select the driver portion of the row decoder circuit. MOS decode circuitry provides predecode signals comprising the primary select signal $S_1^*$, and the secondary select signal, $S_2$. Although the specific decode circuitry determining the values of $S_1^*$ and $S_2$ can vary, the variations are well known in the art. FIGS. 1–3 have been included to provide examples of portions of possible decode circuitries. FIG. 1 is an example of a portion of a CMOS NAND decode circuit wherein each of the secondary select signals, $S_{2A}$, $S_{2B}$, $S_{2C}$ and $S_{2D}$, is a one of four decode having four phases, and wherein $S_1^*$ (not shown) comes from a one of 64 CMOS NAND decode used to decode 256 wordlines. FIG. 2 is an example of a portion of a CMOS NOR decode circuit wherein each of the primary select signals, $S_{1A}^*$, $S_{1B}^*$, $S_{1C}^*$ and $S_{1D}^*$, is a one of four decode using four phases, and wherein secondary select signal $S_2$, (not shown), comes from a one of 64 CMOS NOR decode used to decode 256 wordlines.

In the circuits of FIGS. 1 and 2, the secondary select signal controls the activation of a single pass transistor. The decode circuitry may employ the tree decode configuration wherein a plurality of serially connected pass transistors are activated in order to drive the selected wordline to a high logic level. In the example depicted by FIG. 3 predecode address signals activate three serially connected pass transistors. For example if predetermined address signals RA56 (0), RA34(0), and RA12(0) are high and the remaining predecode addresses are low, transistors 1, 2, and 3 are activated providing an electrical path between points 4 and 5. These decode circuitries are well known to those skilled in the art.

Figure 4:
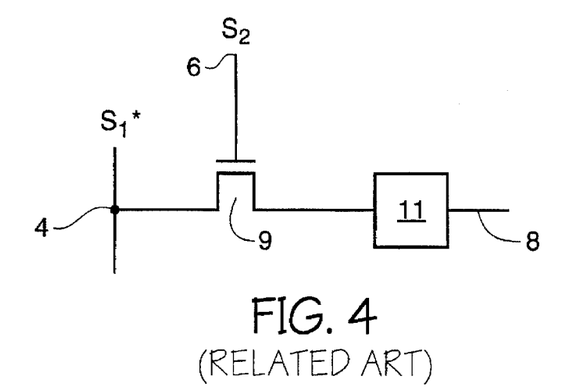
FIG. 4 is a schematic of a driver circuit of a row decoder circuit of the related art.

FIG. 4 is a simplified schematic of the driver circuit of the related art. Each wordline in the array has a similar driver circuit. In FIG. 4, a MOS decode has been utilized to provide a primary select signal $S_1^*$ at primary select node 4 and a secondary select signal $S_2$ at secondary select node 6. The select signals $S_1^*$ and $S_2$ control the potential of the wordline 8. The primary select signal is transmitted through NMOS transistor 9 to an inverter/latch portion 11 when the secondary select signal is high. When select signal $S_2$ is high, NMOS transistor 9 activates and the select signal $S_1^*$ is inverted to the wordline 8.

Figure 5:
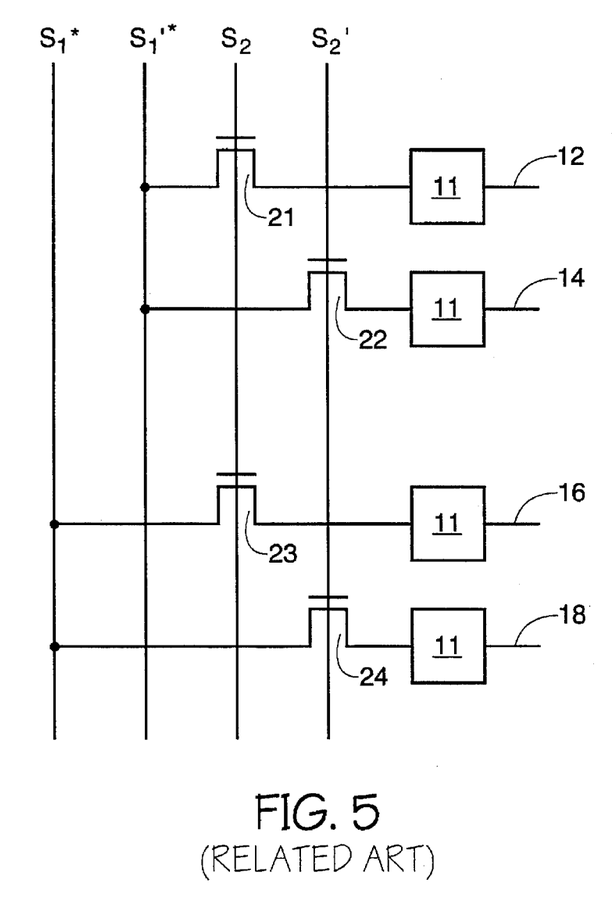
FIG. 5 is a portion of a row decoder circuit for providing a simplified example of wordline selection of the related art.

FIG. 5 is a simplified schematic of a portion of the decode circuitry of a typical row decoder of the related art. Primary select signals $S_1^*$ and $S_1'^*$ and secondary select signals $S_2$ and $S_2'$ are generated by decode circuitry (not shown). The purpose of this discussion is to provide an understanding of the final mechanism for activating and deactivating the wordlines and to provide an understanding of the relationship between the select signals and the driver circuit. At the onset of each read or write cycle, all of the wordlines are typically reset to a low potential. In this case, select signals $S_1^*$, $S_1'^*$, $S_2$, and $S_2'$ have a high potential which take the potentials of the wordlines 12, 14, 16, and 18 low.

During the selection of a wordline the secondary select signals go low except for the secondary select signal which activates the pass transistor in electrical communication with the selected wordline. All of the primary select signals remain high except for the primary select signal which must be inverted to the selected wordline.

Still referring to FIG. 5, assume the desired address selects wordline 14. In this case select signal $S_2$ goes low and select signal $S_2'$ is high; and select signal $S_1'^*$ goes low, and select signals $S_1^*$ is high. The low select signal $S_1'^*$ is inverted to wordline 14 through activated transistor 22. Although transistors 21 and 23 are deactivated the wordlines 12 and 16 remain at the initial low potential due to a latching of the low potential by the inverter/latch portion 11 of the driver circuits. Wordline 18 is driven low when the high potential of $S_1^*$ is driven through activated transistor 24 and inverted to wordline 18.

Figure 6:
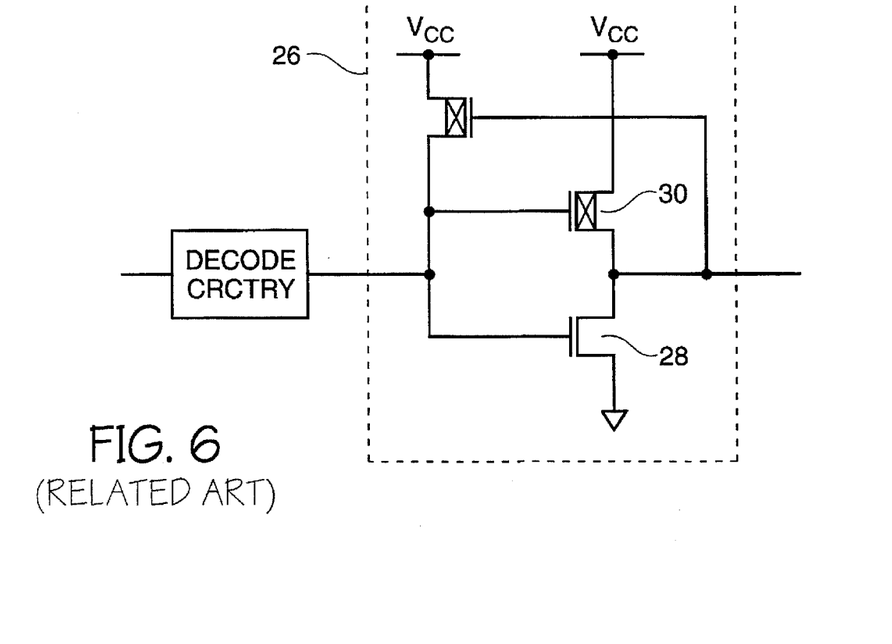
FIG. 6 is a schematic of a portion of a row decoder circuit of the related art.

FIG. 6 is exemplary of driver circuitry 26 of a row decoder circuit of the related art. A non-selected wordline is pulled toward the reference potential through transistor 28 and a selected wordline is pulled toward a high potential of $V_{cc}$ through transistor 30. Throughout this discussion $V_{cc}$ refers to a supply potential externally applied to the circuit. One typical value of $V_{cc}$ is 5 volts.

Figure 7:
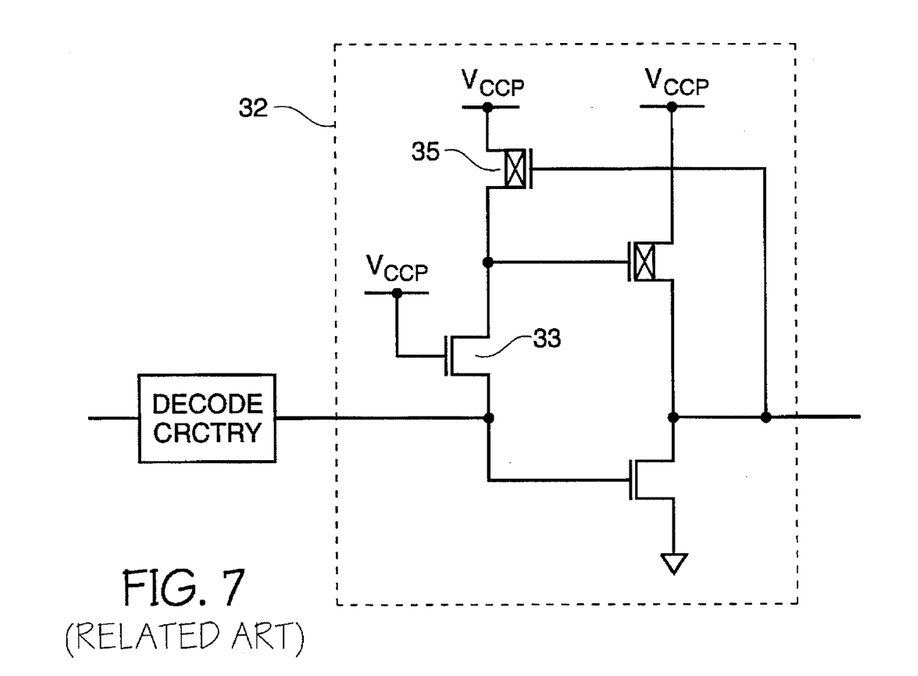
FIG. 7 is a schematic of a portion of a row decoder circuit of the related art.

FIG. 7 is exemplary of further driver circuitry 32 of the related art. Transistor 33 is used during power up of the device to isolate transistor 35's p-type drain from $V_{cc}$ until $V_{ccp}$ has reached it full potential. $V_{ccp}$ is a potential generated internally by pumping the supply potential to a greater value. Typically $V_{ccp}$ is 1 to 2 volts greater than $V_{cc}$. Charge pumps used for generating $V_{ccp}$ are well known to those skilled in the art and may take several embodiments. There are at least two advantages to using a $V_{ccp}$ rather than a $V_{cc}$. First the device has better write back to a memory cell and secondly the digit lines are pulled to a high logic state faster than when $V_{cc}$ is used.

In order to conserve power supply potentials of many memory devices have been decreased from the typical 5 volt supply. A low supply voltage of 3.3 volts is increasingly replacing the 5 volt operation. There are disadvantages associated with the lower supply potentials.

Sensing a high logic state on the digit lines becomes more difficult as the value of the supply potential deceases since there is typically a decrease in the potential stored. Sensing the high logic state on the digit line is referred to as "1"s detection.

It is another well known problem in the art that the difference in potential between a wordline and a corresponding digit line can easily cause leakage current thereby sacrificing the integrity of the memory device by allowing the charge stored in the storage capacitor to discharge. Ultimately when the cell is selected the cell may contain erroneous data.

The access devices in the array see a certain minimum digit line potential during the majority of the period of one cycle of cell selection. In current applications the digit lines are typically held at the ground reference potential, therefore a $V_{gs}$ of 0 volts may well allow the access device to conduct leakage current.

When there is an increased rate of charge leakage the cell's "1"s charge is mistaken for a zeros charge and faster refresh cycles are required in order to provide memory preservation thereby increasing power consumption.

The leakage current of a particular DRAM access device can have, given a specific gate to source voltage ($V_{gs}$), and still have data retention for a given refresh specification is defined by the equation Leakage=CdV/dt, where C is the capacitance of the storage capacitor, Dv is about half of the operating potential, and dt is the time between refresh cycles. For a typical DRAM cell capacitance, refresh specifications and operating potential, the leakage current must be smaller than or equal to 1 to 2 pico amp for a given $V_{gs}$ of zero volts.

This region of operation near $V_{GS}$=0V and less than the threshold voltage of the device is typically defined as the subthreshold leakage region. This subthreshold leakage (or current), is proportional to the log of Gate-Source voltage in this region. The threshold voltage is the minimum voltage that must be applied between the gate and the source in order that appreciable current flows in the device. A subthreshold characteristic is the response of the access device to the subthreshold potential.

There is a direct correlation between a device subthreshold characteristics and the amount of drive available when using the device as a digital switch or an analog driver. Low threshold voltage devices, such as those having threshold voltages equal to 0 volts, typically have good drive characteristics, however they typically have high leakage characteristics. Thus, it is difficult to simultaneously acquire good drive and good subthreshold or leakage characteristics.

Although DRAM's are generally manufactured with as few mask steps as possible, often one mask step is added to the manufacturing process to effectively create two different types of devices, one of which has good leakage characteristics and one of which has good drive characteristics. Both types of devices have a similar carrier type. The device with good leakage characteristics is used for access devices in the memory array, and the device with good drive characteristics is used in the peripheral circuitry. In this discussion the peripheral circuitry comprises all circuitry on the memory device other than access devices.

OBJECTS OF THE INVENTION

An object of the invention is to decrease process fabrication steps. The invention features a circuit and method for holding the non-selected wordlines at a negative potential with respect to the minimum potential of the digit lines. It is possible to fabricate a low threshold voltage access device having good leakage characteristics by holding its gate at a negative potential. This low threshold voltage fabricaton technique produces a device which has good drive and its leakage characteristics are not damaging to the refresh. Therefore only one type of device need be fabricated and fabrication steps are minimized, and the device operates at increased speeds.

A further object of the invention is improved "1"s detection. By pumping the non selected wordlines to the negative potential improved "1"s are restored to accessed memory storage cells, since the low threshold voltage access devices allow more charge to be stored on any given memory storage cell for a given supply potential. Thus, $V_{cc}$ may be used as a supply potential rather than $V_{ccp}$, thereby minimizing power consumption and maintaining full efficiency during the write back.

SUMMARY OF THE INVENTION

The invention is directed to a circuit and method for maintaining a negative potential, with respect to the digit line potential, on non-selected wordlines.

DETAILED DESCRIPTION OF THE INVENTION

Figure 8:
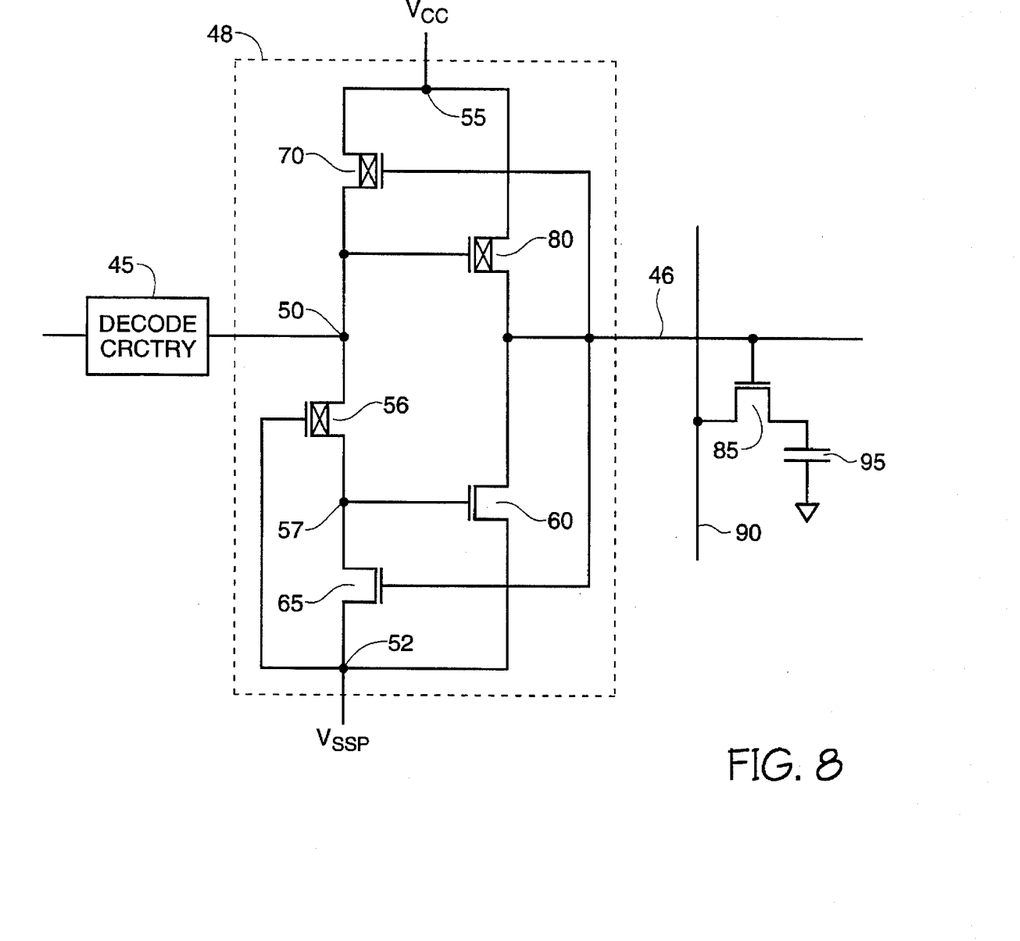
FIG. 8 is a schematic representation of a portion of a row decoder of one embodiment of the invention.

FIG. 8 is a schematic representation of a portion of a row decoder of a first embodiment of the invention. A decode circuit 45 determines whether the wordline 46 is active (selected) or inactive (not selected) or whether all of the wordlines are reset (off). A driver circuit 48 drives the wordline 46 to the desired potential. A signal at node 50 is high in order to reset the wordlines to a negative potential or in order to drive an inactive wordline to a negative potential. A high signal at node 50 is referred to as a non-select signal. A signal at node 50 is low in order to drive an active wordline to a high potential. A low signal at node 50 is referred to as a select signal.

In the case where an N-channel access device is fabricated in a p-type material, either the substrate or a p-well, the invention is characterized as having a negative node 52 pumped to a negative supply potential, $V_{ssp}$. $V_{ssp}$ is typically −1 volt but may be any potential having a value less than the minimum digit line potential and greater than or equal to the maximum Vbb, the substrate potential. Vbb is typically about −1.5 volts for a p-type substrate. The substrate is pumped to Vbb by a pumping circuit well known to those skilled in the art. In current memory devices the digit lines are typically driven to ground potential during memory access and refresh cycles. The negative supply potential is usually less than the ground reference potential. $V_{ssp}$ is generated by a negative potential generator well known to those skilled in the art. The invention is also characterized as having a positive node 55 connectable to a positive supply potential, $V_{cc}$, typically in the range of potentials between 5 volts and 3.3 volts. As one skilled in the art can see the circuit also functions with potentials other than those stated; one limitation being that the potential of positive node 55 must be more positive than the potential of negative node 52.

A non-select signal having a high potential at node 50 and the negative potential on negative node 52 bias PMOS transistor 56 on taking node 57 to a high potential thereby actuating pull down NMOS transistor 60. Continually gated PMOS transistor 56 is used during power up of the device to isolate transistor 65's N-type drain from $V_{ss}$ until $V_{ssp}$ has reached it full potential and is used as an aid to quickly drive the wordline to a negative potential. The wordline 46 is driven to a negative potential when driven toward $V_{ssp}$ at negative node 52 through pull down NMOS transistor 60.

It can be seen that NMOS transistors 65 and PMOS transistor 70 are responsive to the potential of the wordline 46, a low potential on wordline 46 actuating transistor 70 thereby ensuring a high potential on node 50 and a low potential on wordline 46. Thus the wordline are reset and latched to the low potential. Typically all of the wordlines are latched to the negative potential at the onset of a cycle of cell selection. Only the active wordline is allowed to transition to a high potential.

In the case where the wordline is active the decode circuit 45 provides a select signal at node 50. The select signal has a low potential and actuates PMOS transistor 80 pulling a potential of the wordline 46 toward the high supply potential at positive node 55 through pull up PMOS transistor 80. NMOS transistor 65 is actuated by the high potential on the wordline 46 and PMOS transistor 70 is deactuated. Therefore node 50 is latched to a low potential and the wordline 46 is latched to a high potential.

By driving a negative potential or a potential lying between a potential of the digit lines and a potential of a reference medium to an inactive wordline it is possible to utilize an N-channel access transistor 85 having a low threshold voltage. Since the low threshold voltage access transistor 85 has both good drive and good leakage characteristics only one access device need be interposed between the digit line 90 and the storage cell 95. In addition, all N-channel transistors on the entire chip may be fabricated to have low threshold voltages. The N-channel transistors thus formed provide high drive in the periphery circuitry and minimize leakage in the array thereby improving the performance of the device.

Figure 9:
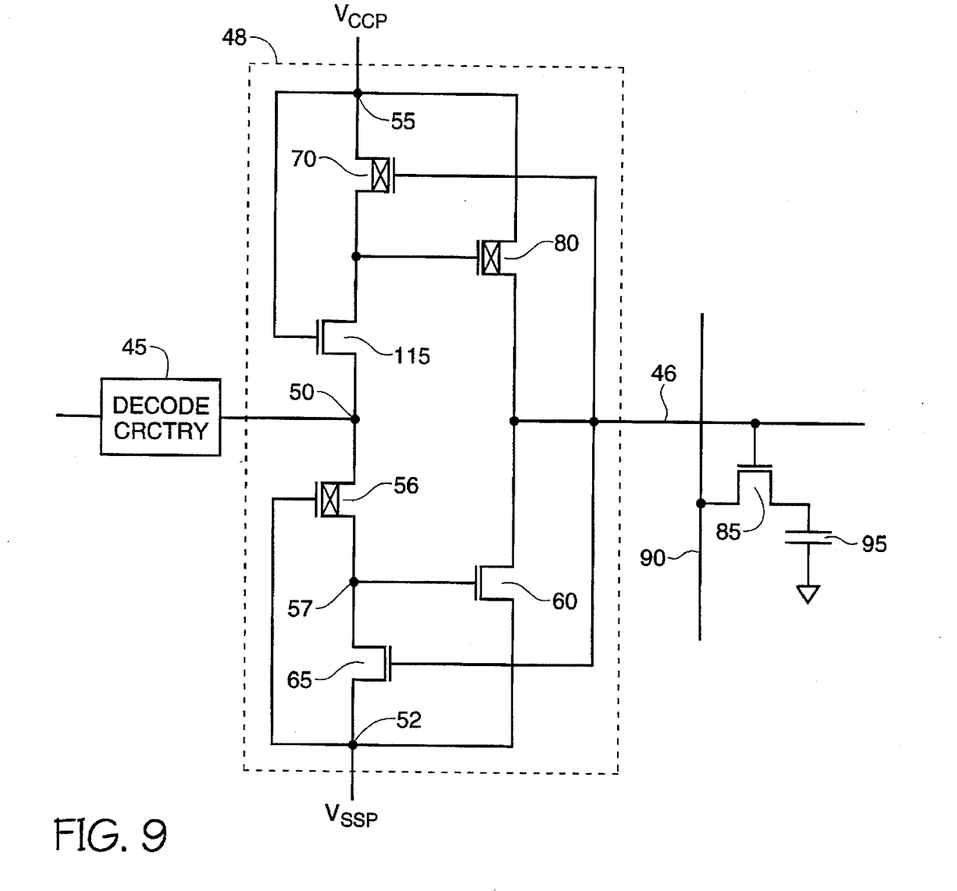
FIG. 9 is a schematic representation of a portion of a row decoder of one embodiment of the invention.

In a second embodiment of the invention shown in FIG. 9 continually gated NMOS transistor 115 is utilized to prevent the N-well of PMOS transistor 70 from forward biasing during power up and is used as an aid to quickly drive the wordline to a positive potential. It can be seen that the circuit of FIG. 9 is otherwise the same as the circuit shown in FIG. 8, therefore identical components have been given the same number.

Figure 10:
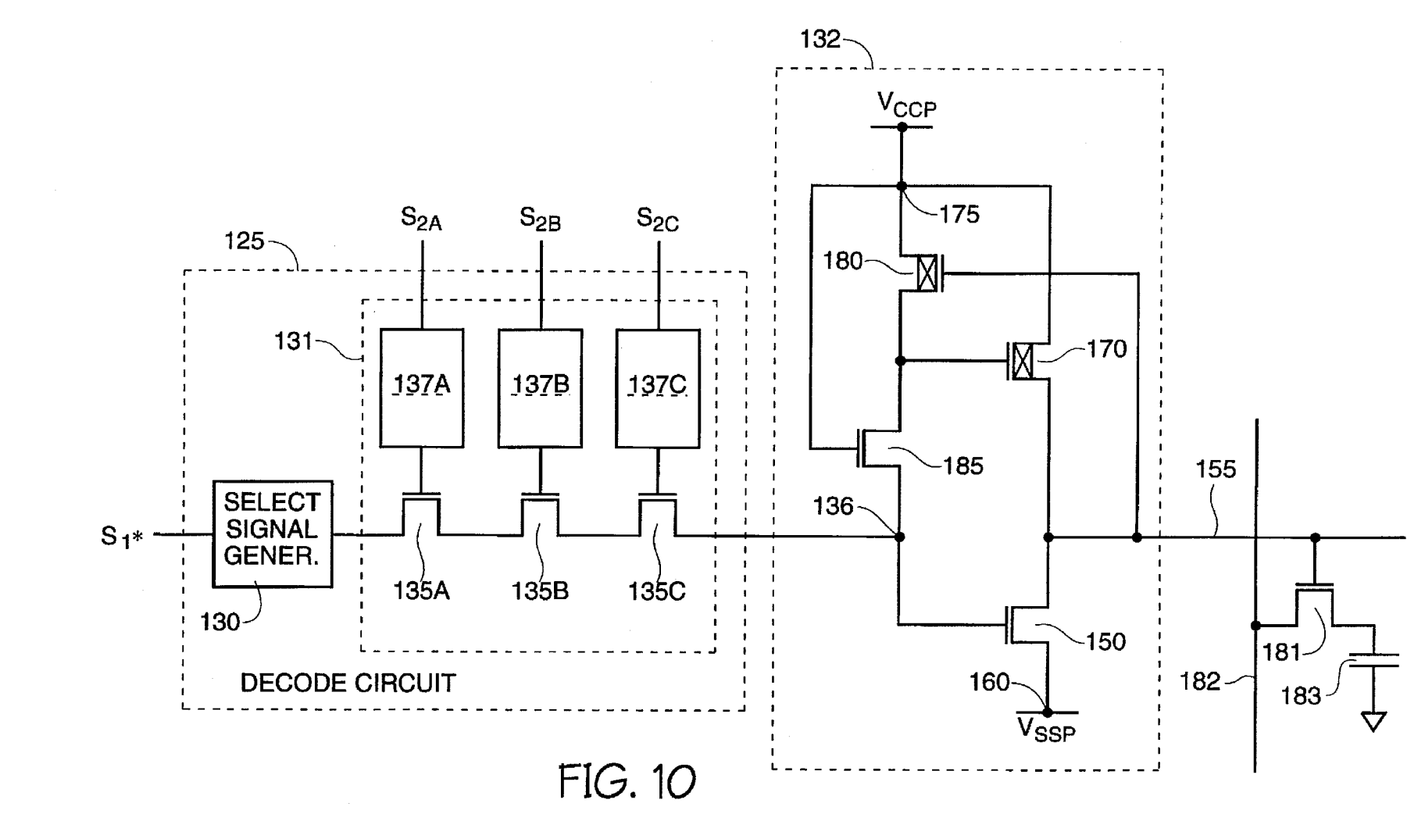
FIG. 10 is a schematic representation of a portion of a row decoder of one embodiment of the invention.

The circuit shown in FIG. 10 is a further embodiment of the row decoder of the invention. The decode circuit 125 of the row decoder comprises a select signal generator 130 and a tree decode circuit 131 driven by secondary select signals $S_{2A}$, $S_{2B}$, and $S_{2C}$. The select signal generator 130 provides a select signal having a negative potential to the driver portion 132 of the row decoder.

A portion 131 of a tree decode circuit is used in this embodiment to determine which wordlines are active and inactive. However, other decode means may be used in place of the decode circuit. In order to simplify the drawing, only three decode transistors 135 A, B, and C have been shown. For further tree decode circuitry the reader is referred to the background information pertaining to FIG. 3. In any case, it is necessary to ensure that the NMOS pass transistors 135A–C electrically interposed between driver input node 136 and the select signal generator 130 are deactuated when desired. Level translator circuits 137A–C are used to keep each transistor 135A–C respectively from inadvertently actuating when the select signal is negative. The level translator circuits 137A–C provide a negative potential to deactuate its corresponding transistor.

The driver portion 132 of the row decoder comprises a pull down NMOS transistor 150 interposed between the wordline 155 and a negative node 160. Negative node 160 is connectable to a negative potential, $V_{ssp}$. $V_{ssp}$ is generated by a negative potential generator well known to those skilled in the art. $V_{ssp}$ is typically equal to −1, although $V_{ssp}$ may be other potentials less than the minimum digit line potential and greater than or equal to $V_{bb}$ when the substrate is p-type. Typically $V_{ssp}$ is less than a ground reference potential. Since the potential at driver input node 136 is actually the gate potential of pull down NMOS transistor 150 it is necessary that the select signal have a sufficient negative potential that the pull-down transistor 150 is not forward biased during the selection of the wordline 155. This is a requirement since the source, negative node 160, of the NMOS transistor 150 is at $V_{ssp}$. The select signal generator accomplishes this purpose.

As in the previous case a negative potential on driver input node 136 represents a select signal and a positive potential on driver input node 136 represents a non-select signal. In the present embodiment the select signal generator 130 ensures that the select signal at driver input node 136 is substantially equal to $V_{ssp}$ thereby ensuring that NMOS transistor 150 remains deactuated when the wordline is activated. When the wordline is selected $V_{ssp}$ at driver input node 136 actuates PMOS transistor 170 thereby pulling a potential of wordline 155 toward $V_{ccp}$ connected to positive node 175 through PMOS transistor 170, and $V_{ssp}$ deactuates transistor 150.

In the case where the wordline 155 is inactive, a high select signal at driver input node 136 actuates NMOS transistor 150 pulling the potential of the wordline 155 toward $V_{ssp}$ through NMOS transistor 150. Thus the wordline attains a negative potential. The wordline is latched to the negative potential when the negative potential on the wordline actuates PMOS transistor 180 thereby pulling a potential of the driver input node 136 to a high potential. Therefore even though one of the transistors 135A–C may be deactuated thereby isolating driver input node 136 from further control signals the wordline is latched to the negative potential.

The negative potential of an inactive wordline is applied to the gate of a low threshold access transistor 181 electrically interposed between the digit line 182 and storage cell 183. It should be noted that each wordline may be electrically connected to a plurality of access transistors at their respective gate inputs.

Continually gated NMOS transistor 185 is utilized to prevent the N-well of PMOS transistor 180 from forward biasing during power up, and is used to provide a resistive element during the activation of the wordline. When performing the resistive function there is a potential loss across transistor 185 allowing the potential on the gate of transistor 150 to decrease more rapidly deactuating transistor 150 and allowing the drive of transistor 170 to become more efficient, thereby driving the wordline more quickly toward $V_{ccp}$.

Figure 11:
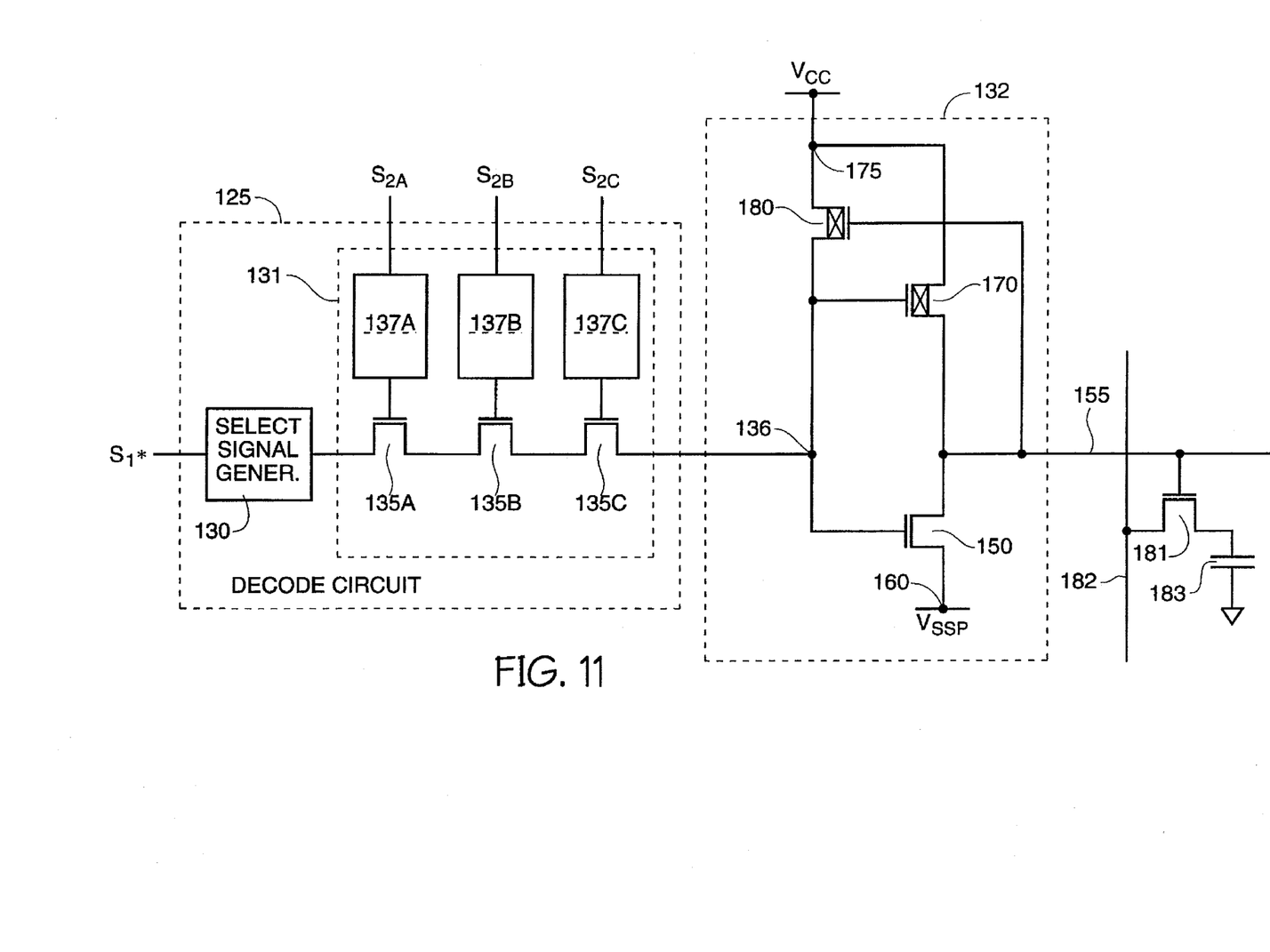
FIG. 11 is a schematic representation of a portion of a row decoder of one embodiment of the invention.

A further advantage of the invention lies in the fact that a pumped potential of $V_{ccp}$ is not necessary in order to have improved write back to the cell. A circuit of the invention wherein $V_{cc}$ is the supply potential is shown in FIG. 11. Where applicable the component numbers used in FIG. 10 are also used in FIG. 11. Since the access transistor 181 of the invention is a low threshold voltage device the gate to source potential is minimal when the access device is actuated. Therefore the access device allows the cell to charge to a desired high potential even though the potential on the gate of the access device is pulled toward $V_{cc}$ rather than $V_{ccp}$. Since the circuit provides a full write back to the cell without the use of a pumped potential equal to $V_{ccp}$, power is conserved. It is interesting to note that it is not necessary to have the transistor 185 shown in FIG. 10 in the circuit of FIG. 11 due to the fact that $V_{cc}$ is at a low enough potential that the problems associated with deactuating transistor 150 and actuating transistor 170 are minimized. Therefore there is also a die space savings as well as a power savings in this embodiment of the invention.

Figure 12:
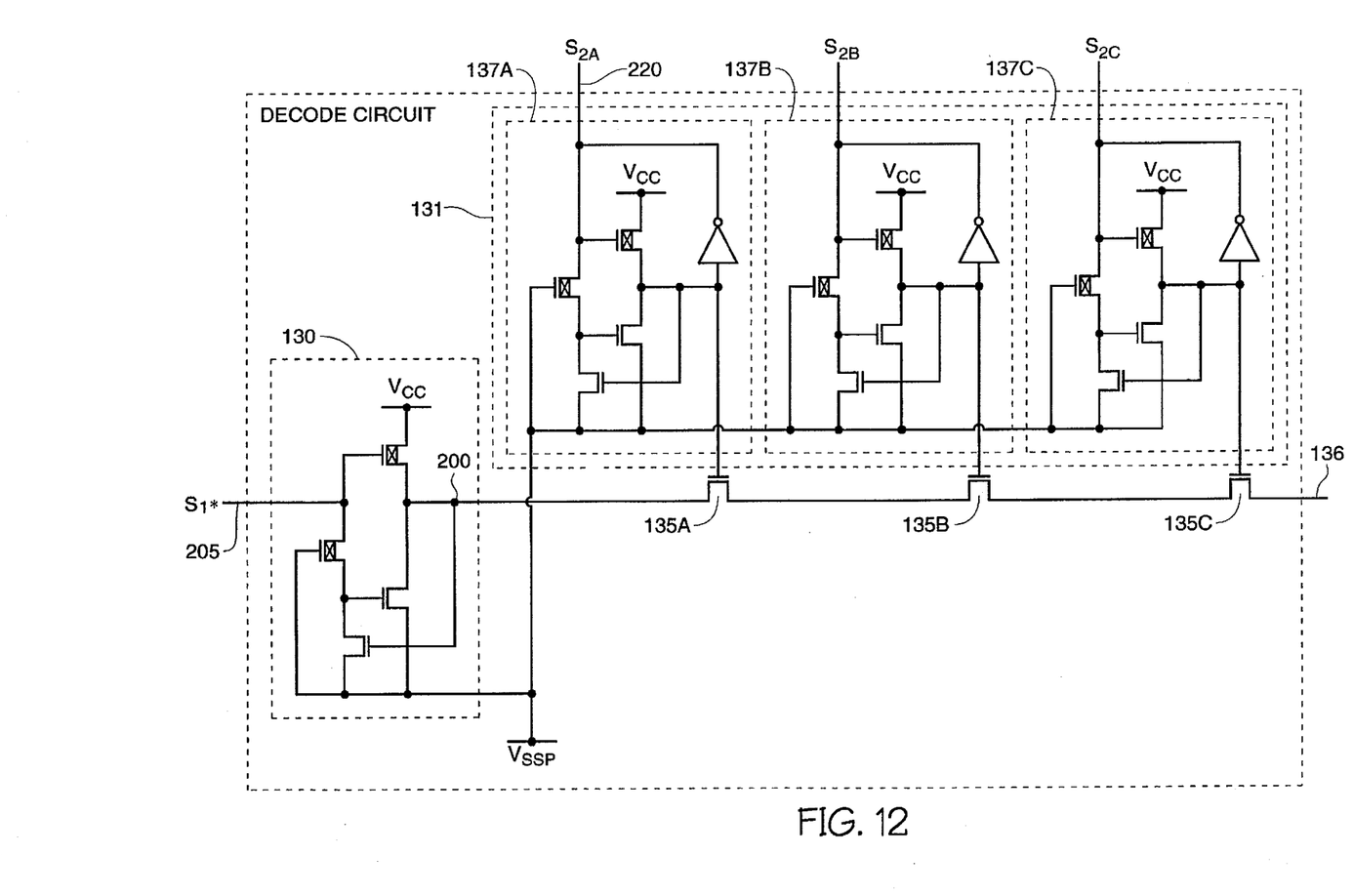
FIG. 12 is a detailed schematic of a decode circuit of the invention.

FIG. 12 is a detailed embodiment of the select signal generator 130 and the level translator circuit 131. The select signal generator 130 generates a signal having a negative potential at its output node 200 substantially equal to $V_{ssp}$ when the primary select signal, $S_1^*$, at its input node 205 has a high potential. The negative potential is then coupled to driver input node 136 through actuated tree decode transistors 135A, 135B, and 135C. The negative potential at driver input node 136 functions as a select signal to activate a wordline.

When $S_1^*$ has a low potential, node 200 is driven to a high potential by the select signal generator 130. The high potential is then coupled to driver input node 136 through actuated tree decode transistors 135A, 135B, and 135C. The high potential at driver input node 136 functions as a non-select signal to inactivate wordlines by driving them to a negative potential.

The level translator circuit 137A will serve as an example of the level translator circuits 137A–C. The level translator circuit 137A holds the gate potential of the tree decode NMOS transistor 135A at a potential equal to $V_{ssp}$ when the secondary select signal, $S_{2A}$, at input node 220 is high thereby eliminating the possibility of inadvertently forward biasing transistor 135A when the signal at node 200 is equal to $V_{ssp}$. $V_{ssp}$ is generated by a negative potential generator well known to those skilled in the art. When the secondary select signal at node 220 is low the level translator inverts the low to actuate transistor 135A.

The inactive wordlines of the invention are held at a negative potential making it possible to utilize a low threshold voltage access device, and the leakage current is eliminated. Since a low threshold voltage access device has good drive and leakage characteristics it is now possible to manufacture the memory device using only one type of N-channel device for both access and peripheral drive devices thereby minimizing fabrication steps and increasing device speed. In addition improved "1"s are stored in the memory cell increasing "1"s detection and increasing the time between refresh cycles.

The preceding detailed description has described the invention with respect to an N-channel access device fabricated on a p-type material. However, it is equally conceivable that the invention pertain to a P-channel access device fabricated in an N-type substrate or N-well. In the later case a non-selected wordline is driven to a potential greater than the highest digit line potential and less than or equal to the minimum potential of the substrate or well potential. In both embodiments, that using an N-channel access device and that using a P-channel device, the well or substrate material in which the access device is fabricated will be referred to as the reference medium.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A row decoder circuit for driving a wordline to a first potential and a second potential, wherein the second potential has a value less than a ground reference potential, and for determining which of said first and second potentials shall be driven to said wordline, the row decoder circuit comprising:
   a) a driver input node for receiving select and non-select signals, the wordline driven to said first potential in response to said select signal and driven to said second potential in response to said non-select signal;
   b) a negative node connectable to a negative potential having a value less than said ground reference potential;
   c) a pull-down device interposed between the wordline and said negative node and responsive to said non-select signal, wherein said second potential is driven to said wordline when said wordline is pulled toward said negative potential through said pull-down device in response to said non-select signal; and
   d) a latch circuit coupled to said wordline and said driver input node, said latch circuit configured to selectively latch said wordline to said second potential.

2. The row decoder circuit as specified in claim 1, wherein said first potential is an externally generated potential.

3. The row decoder circuit as specified in claim 1, wherein said first potential is a pumped potential created by internally increasing a value of an external potential.

4. The row decoder circuit as specified in claim 1, wherein said second potential on said wordline substantially eliminates a leakage current of an access device in electrical communication with said wordline.

5. The row decoder circuit as specified in claim 1, wherein said latch circuit comprises:
   a) a supply node connectable to a supply potential; and
   b) a pull-up feedback device interposed between said supply node and said driver input node and responsive to said first and said second potentials on the wordline, a potential of said driver input node pulled toward a value of said supply potential through said pull-up feedback device.

6. The row decoder circuit as specified in claim 5, further comprising an anti-latch-up device configured to substantially eliminate unwanted forward biasing of said pull-up feedback device.

7. The row decoder circuit as specified in claim 6, wherein said anti-latch-up device is interposed between said pull-up feedback device and said driver input node and connected to said supply node at a control input, said anti-latch-up device configured to substantially eliminate unwanted forward biasing of said pull-up feedback device.

8. A row decoder circuit for driving a wordline to a first potential and a second potential, wherein the second potential has a value less than a ground reference potential, and for determining which of said first and second potentials shall be driven to said wordline, the row decoder circuit comprising:
   a) a driver input node for receiving select and non-select signals, the wordline driven to said first potential in response to said select signal and driven to said second potential in response to said non-select signal;
   b) a negative node connectable to a negative potential having a value less than said ground reference potential;
   c) a pull-down device interposed between the wordline and said negative node and responsive to said non-select signal, wherein said second potential is driven to said wordline when said wordline is pulled toward said negative potential through said pull-down device in response to said non-select signal; and
   d) a static circuit configured to maintain said select signal at a level capable of driving said wordline to said first potential.

9. The row decoder circuit as specified in claim 8, wherein said static circuit further comprises a pull-down feedback device interposed between said negative node and said driver input node and responsive to said first and said second potentials on the wordline, a potential of said driver input node pulled toward a value of said negative potential through said pull-down feedback device to perpetuate the potential at said driver input node having a same effect as said select signal.

10. The row decoder circuit as specified in claim 9, further comprising an anti-latch-up device interposed between said pull-down feed-back device and said driver input node and connected to said negative node at a control input, said anti-latch-up device configured to substantially eliminate unwanted forward biasing of said pull-down feedback device.

11. A row decoder circuit for driving a wordline to a first potential and a second potential, wherein the second potential has a value less than a ground reference potential, and for determining which of said first and second potentials shall be driven to said wordline, the row decoder circuit comprising:
   a) a driver input node for receiving select and non-select signals, the wordline driven to said first potential in response to said select signal and driven to said second potential in response to said non-select signal;
   b) a negative node connectable to a negative potential having a value less than said ground reference potential;
   c) a pull-down device interposed between the wordline and said negative node and responsive to said non-select signal wherein said second potential is driven to said wordline when said wordline is pulled toward said negative potential through said pull-down device in response to said non-select signal; and
   d) a select signal generator in electrical communication with said driver input node, said select signal generator configured to generate said select signal to have a negative potential less than the ground reference potential.

12. The row decoder as specified in claim 11, further comprising:
   a) a pass device electrically interposed between said select signal generator and said driver input node, said pass device, when actuated, passing said select and said non-select signals from an output node of said select signal generator to said driver input node, said pass device having a control input; and b) a level translator circuit in electrical communication with said control input of said pass device and configured to generate a negative potential less than a ground reference potential at said control input.

13. A circuit having a plurality of memory cells, a plurality of digit lines, and a plurality of wordlines, each one of the memory cells located at an intersection of one of the digit lines and one of the wordlines, comprising:

a) a means for selecting a non-selected wordline of said plurality of wordlines, said non-selected wordline associated with a non-selected memory cell of said plurality of said memory cells;
   b) a means for driving a potential to the non-selected wordline which is less than a lowest potential driven to any of the digit lines of the plurality during an operation of the circuit; and
   c) a latch circuit configured to latch the potential to the non-selected wordline.

14. A system, comprising:

a) a circuit having a plurality of memory cells for storing data;
   b) a plurality of digit lines for accepting the data;
   c) a plurality of wordlines, each one of said memory cells located at an intersection of one of said digit lines and one of said wordlines;
   d) a microprocessor for generating an addresses for selecting one of said memory cells for access;
   e) a decode means for selecting a non-selected wordline of said plurality of wordlines in response to the address, said non-selected wordline associated with a non-selected memory cell of said plurality of said memory cells;
   f) a driver means for driving a potential to the non-selected wordline which is less than a lowest potential driven to any of the digit lines of the plurality during an operation of said circuit; and
   g) a latch circuit configured to latch the potential to the non-selected wordline.

15. A module, comprising:

a) a plurality of address nodes;
   b) at least one integrated circuit connected to said plurality of address nodes, said integrated circuit comprising
      i) a plurality of memory cells for storing data;
      ii) a plurality of digit lines for accepting the data;
      iii) a plurality of wordlines, each one of said memory cells located at an intersection of one of said digit lines and one of said wordlines; and
      iv) a decode means for selecting a non-selected wordline of said plurality of wordlines in response to an address on said plurality of address nodes, said non-selected wordline associated with a non-selected memory cell of said plurality of said memory cells;
   c) a driver means for driving a potential to the non-selected wordline which is less than a lowest potential driven to any of the digit lines of the plurality during an operation of the at least one integrated circuit; and
   d) a latch circuit configured to latch the potential to the non-selected wordline.

* * * * *